US005520002A

United States Patent [19]
Ishikawa

[11] Patent Number: 5,520,002
[45] Date of Patent: May 28, 1996

[54] HIGH SPEED PUMP FOR A PROCESSING VACUUM CHAMBER

[75] Inventor: Hiroichi Ishikawa, Kanagawa, Japan

[73] Assignees: Sony Corporation, Tokyo, Japan; Sony Electronics, Inc., Park Ridge, N.J.

[21] Appl. No.: 382,386

[22] Filed: Feb. 1, 1995

[51] Int. Cl.$^6$ ....................................... B01D 8/00
[52] U.S. Cl. ..................... 62/55.5; 62/259.2; 417/901
[58] Field of Search ................... 62/55.5, 259.2, 62/51.1; 417/901

[56] References Cited

U.S. PATENT DOCUMENTS

| | | | |
|---|---|---|---|
| 2,985,356 | 5/1961 | Beecher | 62/55.5 |
| 3,019,809 | 2/1962 | Ipsen et al. | 62/55.5 |
| 3,483,709 | 12/1969 | Baicker et al. | 62/51.1 |
| 3,585,807 | 6/1971 | Hengeross et al. | 62/55.5 |
| 4,072,025 | 2/1978 | Thibault | 62/55.5 |
| 4,438,632 | 3/1984 | Lessard et al. | 62/55.5 |
| 4,803,845 | 2/1989 | Strasser et al. | 62/55.5 |
| 5,062,271 | 11/1991 | Okumura et al. | 62/55.5 |
| 5,345,787 | 9/1994 | Pitlingsrud | 62/55.5 |

Primary Examiner—Ronald C. Capossela
Attorney, Agent, or Firm—Wood, Herron & Evans

[57] ABSTRACT

A high speed pumping apparatus for efficiently and rapidly evacuating a processing chamber to a desired vacuum pressure includes a pump chamber for coupling to the processing chamber and a cryogenic element in the pump chamber to absorb gas particles. The cryogenic element is movable within the pump chamber and has a first position inside the pump chamber and removed from the processing chamber. When the cryogenic element is in the first position, a sealing structure seals the aperture between the pump chamber and the processing chamber. The cryogenic element is movable, through the aperture, to a second position at least partially out of the pump chamber and inside the processing chamber. When in the second position inside of a processing chamber, the cryogenic element absorbs gas particles within the processing chamber and evacuates the chamber to a vacuum pressure. Thereby, the cryogenic element may be exposed to the processing chamber to evacuate the processing chamber and may subsequently be withdrawn into the pump chamber and sealed therein to be protected when the processing chamber is opened to atmospheric pressure.

29 Claims, 4 Drawing Sheets

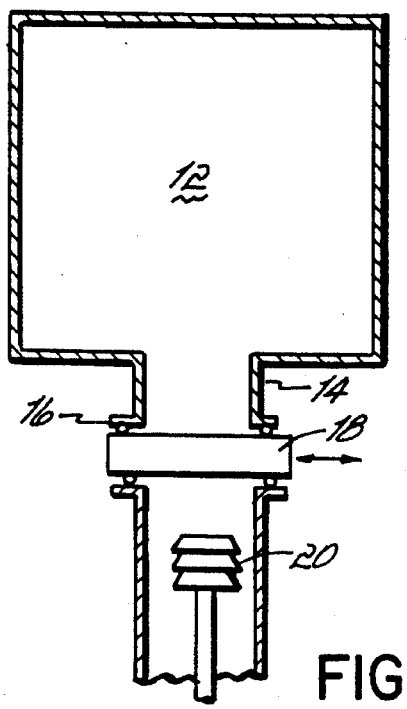
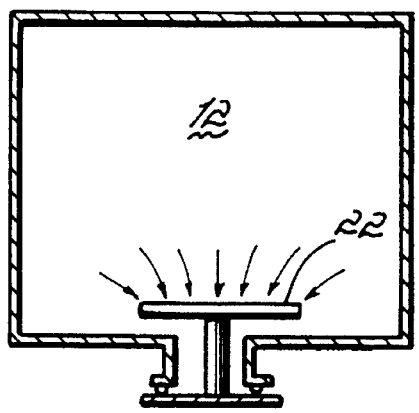
FIG. 2
FIG. 1
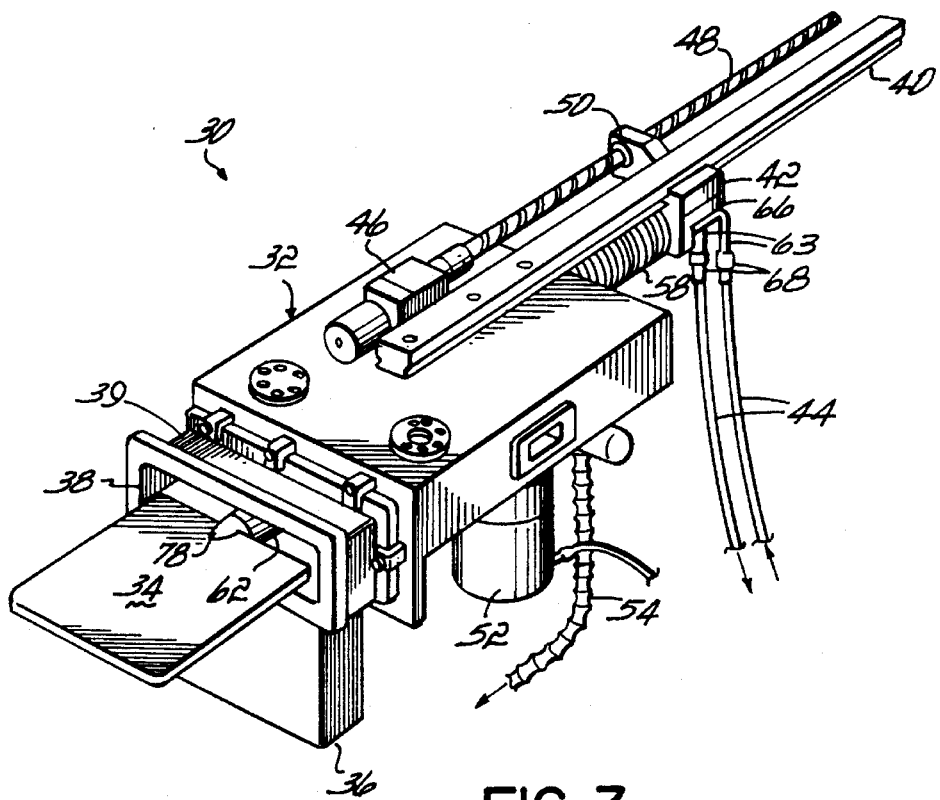
FIG. 3

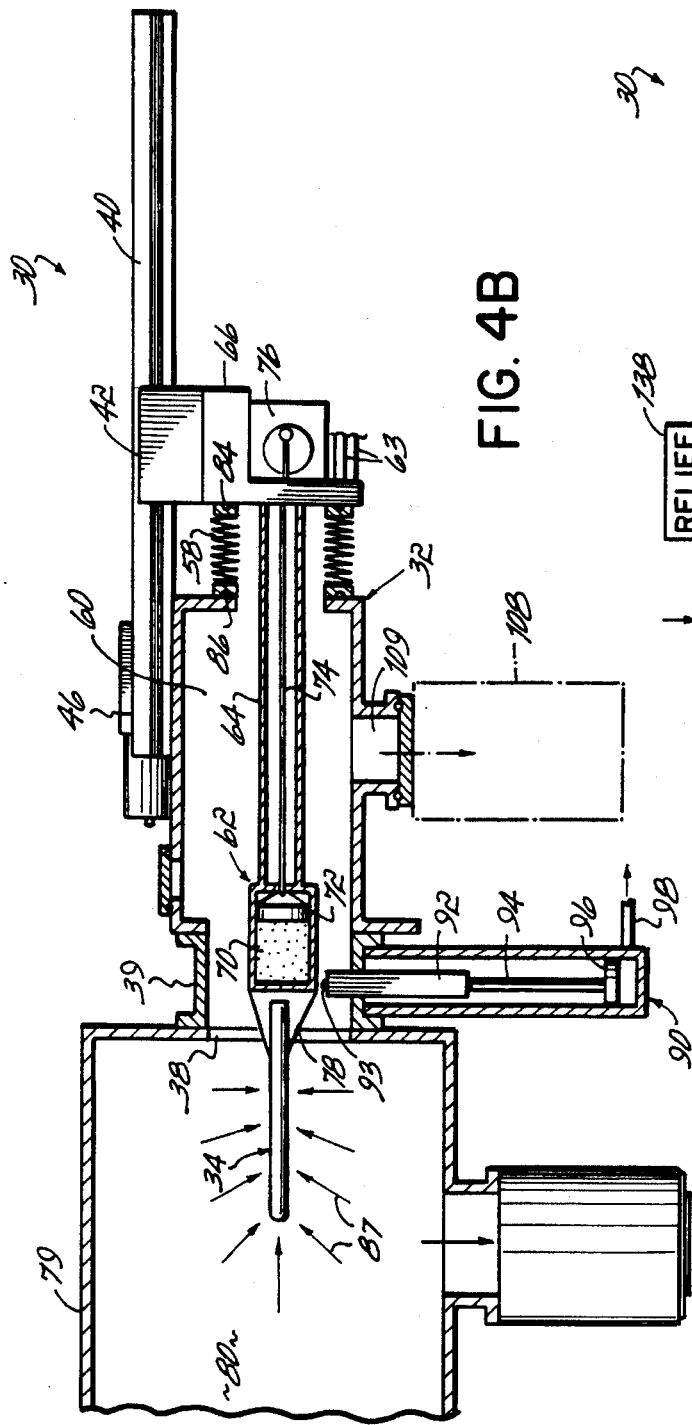
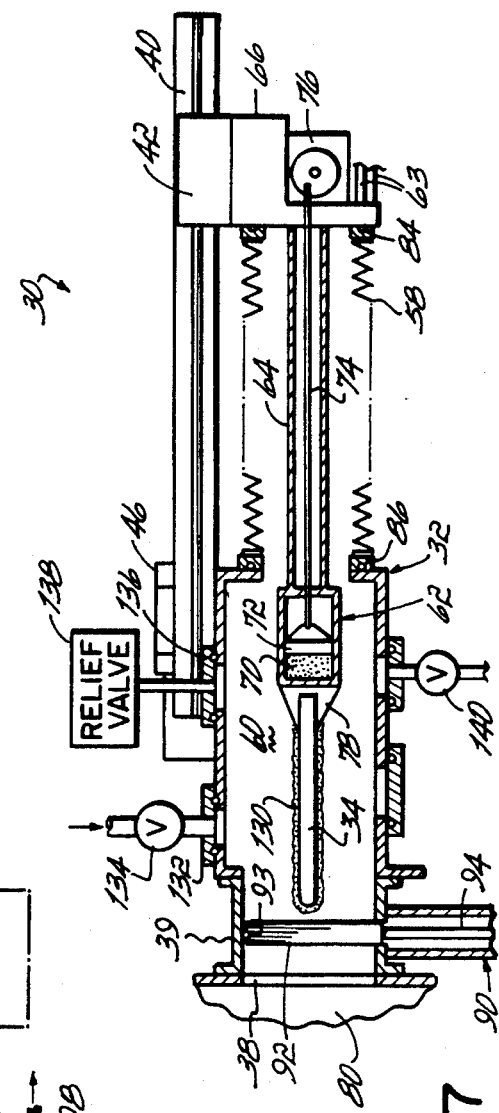
FIG. 4B
FIG. 7

5,520,002

HIGH SPEED PUMP FOR A PROCESSING VACUUM CHAMBER

FIELD OF THE INVENTION

This invention relates generally to vacuum pumps for evacuating processing chambers such as semiconductor PVD systems and more particularly to a high speed pump for rapidly evacuating water vapor and other gases from a processing chamber to produce a low vacuum pressure within the chamber.

BACKGROUND OF THE INVENTION

Vacuum chambers are widely used for many process related applications, such as optical coating, web coating, thin film coating, evaporation, magnetic material application, and load lock construction, to name only a few of the large variety of semiconductor processing techniques where a very low vacuum pressure is required. During such processing, high speed vacuum pumping may be required to evacuate a processing chamber and high speed vacuum pumping may especially be necessary to evacuate water vapor within the chamber because the partial pressure of water generally dominates the total vacuum pressure within the chamber.

Cryopumps are widely used to achieve a high vacuum (low vacuum pressure) within processing chambers. A cryopump is a pump which utilizes a cold array or other cryogenic element inside of a pump housing. The cryopump is coupled to processing chamber and the environment within the chamber is exposed to the cryogenic element. Gas particles within the chamber environment lose their kinetic energy and stick to the cryogenic element which facilitates the pumping action of the cryopump. One significant advantage of a cryopump is its high pumping speed for water vapor. Since the partial pressure of water vapor generally dominates the total vacuum pressure within the processing chamber, high pumping speed for water vapor is very important for high vacuum systems, thus making cryopumps desirable in high vacuum applications.

However, there are several drawbacks to existing cryopumps. Although cryopumps achieve a high pumping speed for water vapor, the full speed of the pump is often not achieved due to physical restrictions within the pump housing. FIG. 1 shows a conventional cryopump arrangement 10 attached to a processing chamber 12. The cryopump includes a tube 14, a connecting flange 16, and a valve 18 which opens and closes to expose the cryogenic element 20 of the pump to the environment of processing chamber 12. As is illustrated in FIG. 1, the dimensions of the cryopump 10 are restricted with respect to the dimensions of the processing chamber 12, As a result, the tube 14, flange 16, and valve 18 have a low conductance which reduces the effective pumping speed for water of the cryopump to generally less than half of the cryopump's original speed. This increases the time necessary to achieve a high vacuum within the processing chamber, and therefore, increases the time necessary to perform the necessary processing steps within the chamber. The increased time, in turn, increases the cost of semiconductor processing or any other processing.

Attempts have been made to overcome the low conductance of conventional cryopump construction. One attempted solution has been to place a stationary cryogenic element, such as a cryogenic panel, within the processing chamber. Referring now to FIG. 2, a cryogenic panel 22 might be placed inside of the processing chamber 12 to eliminate the low conductance of the tube, flange, and valve of FIG. 1. In the pumping arrangement of FIG. 2, the pumping speed of the cryopump is proportional to the area of the cryogenic panel 22 and is not restricted by the low conductance of the housing or the valve assembly surrounding the panel. With the configuration of FIG. 2, a very high pumping speed is achieved.

However, while positioning the cryogenic panel within the processing chamber increases the pumping speed, it creates another drawback. The stationary cryogenic panel 22 is always exposed to the processing chamber environment. When the processing chamber 12 is vented or open to atmospheric pressure, such as to remove or insert substrates or work within the chamber or to maintain or clean the chamber, a large amount of water vapor and moisture along with other gases are introduced into the processing chamber. The moisture has a tendency to stick to a large amount of the cryogenic panel and creates ice on the panel. The temperature rise due to the ice formation disables the pumping function. Accordingly, it becomes necessary to regenerate the cryogenic panel and keep the panel above room temperature before the processing chamber is exposed to atmospheric pressure.

There is a need for a high speed vacuum pump which is not restricted by a low conductance coupling during pumping of a processing chamber in order to rapidly remove gas particles, such as water vapor, from the processing chamber to reduce the wafer processing time and the cost of the processing operation. Furthermore, there is a need for a high speed pumping apparatus which does not require continual regeneration of the cryogenic element when the processing chamber is exposed to atmospheric pressure.

SUMMARY OF THE INVENTION

The present invention addresses the needs within the art by providing a high speed pumping apparatus which efficiently and rapidly evacuates a processing chamber to a desired low vacuum pressure. The apparatus includes a pump chamber which is coupled to the processing chamber through an aperture. A cryogenic element is positioned generally within the pump chamber and is operable to trap or absorb gas particles, such as water vapor, to evacuate the processing chamber to a low vacuum pressure.

In accordance with the principles of the present invention, the cryogenic element is movable between the pump chamber and the processing chamber. More specifically, the cryogenic element has a first position inside of the pump chamber and away from the processing chamber. A sealing structure, such as a vacuum sealing valve, operates to seal and unseal the aperture. The sealing valve seals the aperture when the cryogenic element is in the first position and effectively isolates the pump chamber and cryogenic element from the processing chamber. This allows the processing chamber to be exposed to atmospheric pressure, such as during manipulation of a working substrate or maintenance of the chamber, without exposing the pump chamber and cryogenic element to the atmospheric pressure.

The cryogenic element is movable through the aperture to a second position where it extends out of the pump chamber and into the processing chamber to absorb gas particles from inside the processing chamber. More specifically, the sealing structure unseals the aperture and the cryogenic element is moved into the processing chamber to be exposed to gas particles therein to absorb the particles and pump the processing chamber to a low vacuum pressure. Upon completion of the processing operation, the cryogenic element may be withdrawn into the first position and the aperture sealed to protect the cryogenic element when the processing chamber is again exposed to atmospheric pressure.

In one embodiment of the present invention, the cryogenic element includes a generally planar panel which extends through the aperture into the processing chamber. The surface area of the panel determines the pumping speed, and there is no restriction to the conductance of gas particles to the element within the processing chamber. An alternative embodiment of the panel may include planar extension portions extending at an angle to the panel to increase the surface area of the panel and the effective vacuum speed of the pumping apparatus. The cryogenic panel may be coupled to a linear slide rail by a bearing member so that the panel slides generally linearly within the pump chamber and processing chamber between the first and second positions. The pump chamber includes an expandable bellows portion which expands to receive the cryogenic panel in the first position and contracts when the cryogenic panel is moved to the second position inside the processing chamber. The valve seals and unseals the aperture when the cryogenic element is in the first and second positions respectively.

An alternative embodiment of the present invention utilizes a cryogenic panel which rotates from the first position within the pump chamber to a second position inside the processing chamber.

In one embodiment of the pumping apparatus, the cryogenic panel is thermally coupled to a displacer which includes an expandable volume therein containing a cooling medium. The volume is expanded to lower the pressure of the cooling medium and adiabatically cool the displacer which cools the cryogenic panel by conduction. Alternatively, a cooling medium such as liquid nitrogen might be continuously circulated within the cryogenic panel to cool the panel. In a preferred embodiment, the panel is cooled to a low temperature such as 100° K., so that it effectively pumps water vapor.

A high vacuum pump such as a cryopump or turbo pump may be coupled to either the processing chamber or the pump chamber to be utilized on conjunction with the invented high speed water pumping apparatus, so as to remove other gases besides water vapor. Preferably, the pump chamber is sealed to be isolated from the outside atmosphere so that the cryogenic element is not exposed to atmospheric pressure and moisture. In operation, the processing chamber is vacuumed with a rough vacuum pump to lower the pressure of the processing chamber below a rough set point. Simultaneously, the pump chamber is maintained at a high vacuum (low pressure). When the processing chamber pressure drops below the rough set point, the sealing valve unseals the aperture and the cryogenic panel extends into the processing chamber so that the cryogenic panel is fully exposed to the processing chamber for unrestricted high vacuum pumping.

The cryogenic panel eventually requires regeneration as it absorbs water particles and becomes full. However, because regeneration will not necessarily be needed when the processing chamber is open to atmospheric pressure because the cryogenic panel is retracted and isolated, the time between regeneration cycles is relatively long. Furthermore, since the cold panel may be placed in the first or retracted position, regeneration may be accomplished in the pump chamber so as not to contaminate the processing chamber.

The high speed pumping apparatus of the present invention is particularly useful for evacuating water particles at a high vacuum (low pressure). However, the pumping apparatus might also be utilized to evacuate water particles in a low vacuum (higher pressure) application. Furthermore, the high speed pumping apparatus of the present invention might be utilized to evacuate other gases, besides water vapor, such as argon, nitrogen and oxygen by lowering the temperature of the cryogenic panel.

Accordingly, the present invention provides a high speed, high conductance pumping apparatus which rapidly and efficiently removes water molecules from a processing chamber and thereby rapidly produces a high vacuum within the processing chamber. Furthermore, the cryogenic element of the invention is isolated from the processing chamber when the processing chamber is open to atmospheric pressure. This effectively eliminates the unnecessary regeneration of the cryogenic element. The pump is particularly useful for evacuating water particles and thereby rapidly produces a high vacuum within the processing chamber. Further features and objectives of the present invention will become more apparent from the Brief Description of the Drawings and the Detailed Description of the Invention given hereinbelow.

BRIEF DESCRIPTION OF THE DRAWINGS

The accompanying drawings, which are incorporated in and constitute a part of this specification, illustrate an embodiment of the invention and, together with a general description of the invention given above, and the detailed description given below, serve to explain the principles of the invention.

FIG. 1 is a side view, in partial cross section, of a conventional processing chamber and cryopump configuration;

FIG. 2 is a conventional processing chamber utilizing a stationary cold panel;

FIG. 3 is a perspective view of one embodiment of the high speed pumping apparatus of the present invention;

FIG. 4B is a schematic view, cross-sectional, of the apparatus of FIG. 3 showing the cryogenic panel exposed to the processing chamber;

FIG. 6A is a top view, in partial cross-section, of an alternative embodiment of the present invention utilizing a rotating cryogenic panel with the cryogenic panel in a first position inside the pump chamber, while

FIG. 7 is a schematic view, cross-sectional of an embodiment of the present invention illustrating regeneration of the cryogenic element.

DETAILED DESCRIPTION OF THE INVENTION

Figure 4A:
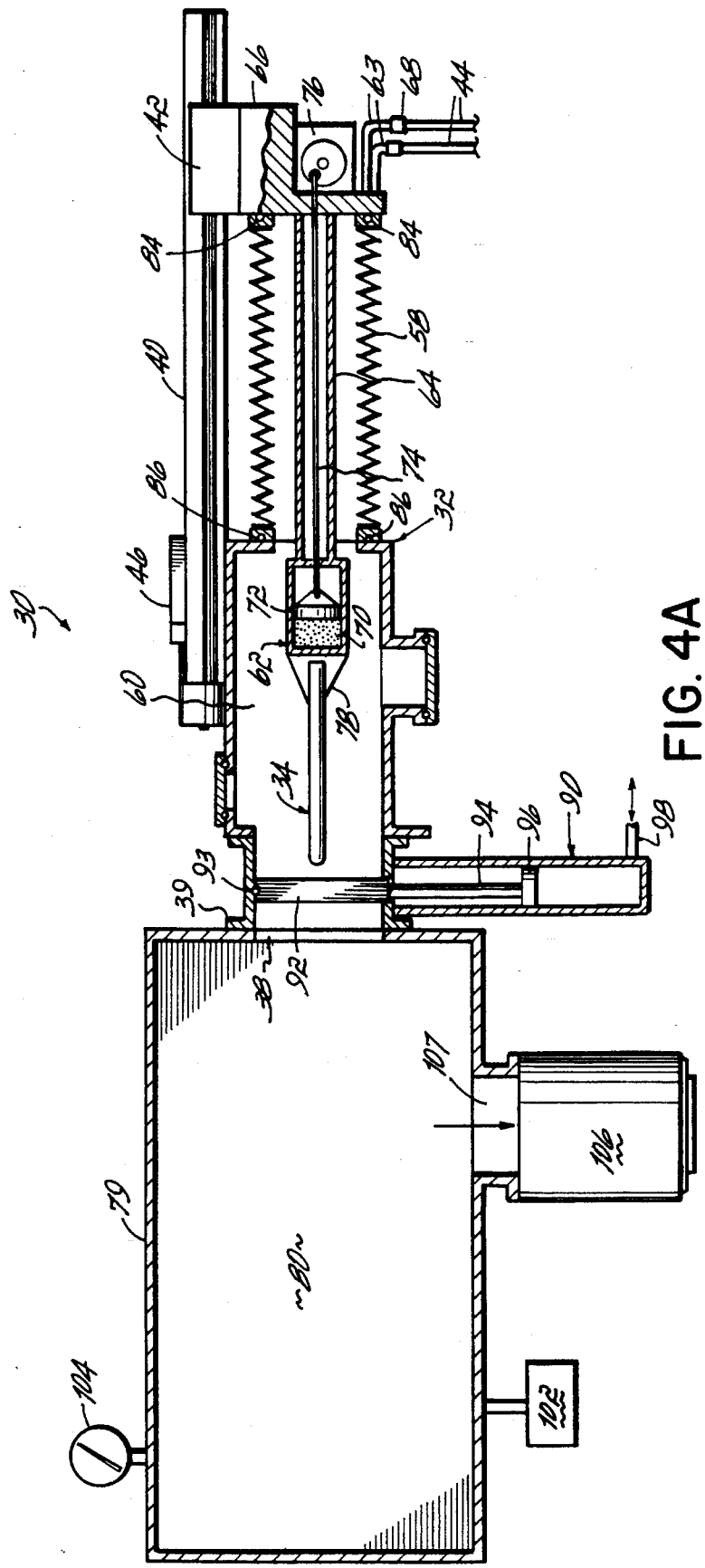
FIG. 4A is a schematic view, cross-sectional, of the apparatus of FIG. 3 showing the cryogenic panel withdrawn into the pump chamber.

Referring to FIG. 3, one embodiment of the high speed pumping apparatus of the present invention is shown with appropriate supply and control lines. Specifically, a high speed pump 30 includes a pump housing 32 which surrounds and supports a cryogenic panel 34 which moves between a first position inside pump housing 32 and a second position outside of the pump housing 32 which is illustrated in FIG. 3. The housing 30 may be formed of stainless steel, aluminum, or other suitable material. The cryogenic panel 34 moves through an aperture 38 defined in a coupling port 39. In use, high speed pump 30 is coupled to a processing chamber through port 39 as illustrated in FIGS. 4A and 4B and further discussed hereinbelow. A sealing structure or sealing valve 36 is coupled to housing 32 proximate to coupling port 39 to seal the aperture 38 when the cryogenic panel 34 is in the first or retracted position and unseal the aperture when panel 34 is in the second or exposed position. Panel 34 is coupled to a generally linear slide rail 40 by a linear slide bearing 42 so that the panel may move between the first and second positions (See FIGS. 4A and 4B). Cooling medium supply lines 44 are coupled to cryogenic panel 34 to supply a cooling mean to the cryogenic panel to lower its temperature. To extend and retract the cryogenic panel 34 within housing 32, a linear motion motor 46 rotates a ball screw 48 which is connected to the bearing 42 by a coupling 50. Rotation of ball screw 48 moves the bearing 42 and slides cryogenic panel 34 between the respective first and second positions. As described further hereinbelow, a high vacuum pump 52 and a roughing pump 54 might be coupled to pump housing 32 for further evacuating the processing chamber through the pump housing.

The high speed pumping apparatus of the present invention operates similarly to a conventional cryopump in the sense that the cryogenic panel 34 of the present invention absorbs the kinetic energy from gas particles which then stick to the cold panel. In effect, the cold panel 34 pumps gas particles from the processing chamber to evacuate the processing chamber to a low pressure. In the present application, the word "absorb" is used to denote the sticking action of the particles to panel 34. In a preferred embodiment of the present invention, the cryogenic panel 34 is cooled to a temperature of approximately 100° K. in order to absorb water vapor particles. As a result, the pump is very effective for high speed pumping of water and thus high speed evacuation of a processing chamber, because the partial pressure of water vapor within a processing chamber generally dominates the total chamber pressure. However, the cryogenic panel might also be maintained at a temperature to absorb other gases. For example, if cryogenic panel 34 is cooled to a lower temperature, such as around 20° K., it will be capable of pumping argon, nitrogen and oxygen, to name only a few possible processing gases.

Referring now to FIG. 4A, housing 32 is connected to an expandable portion or bellows 58 formed of, for example, stainless steel. Housing 32 and bellows 58, define a pump chamber 60 which surrounds the cryogenic panel 34 and associated cooling structure when the cryogenic panel 34 is in the first or retracted position as is illustrated in FIG. 4A. The cryogenic panel 34 is shown in the second or exposed position in FIG. 4B.

Within pump chamber 60, the cryogenic panel 34 is attached to or carried by a displacer 62. The displacer is supported by a generally hollow extension tube 64 which is carried by a generally L-shaped motor supporting member 66 which is connected to slide bearing 42. The tubes 44 connected to a supply of cooling medium (not shown) are coupled to the displacer 62 through lines 63 extending inside or along the extension tube 64. The cooling medium supply tubes 44 are connected to lines 63 through appropriate connectors 68. The displacer 62 defines an internal expandable volume 70 which receives the cooling medium, such a helium or nitrogen. Lines 63 extend the length of the extension tube 64 to deliver the cooling medium to volume 70 (not shown in the FIGS.). A movable piston 72 slides within the displacer volume 70 to expand and reduce the volume. Piston 72 is connected to a piston rod 74 which extends through the extension tube and is connected to a motor 76 held by motor supporting member 66. The motor 76 rotates to move the rod 74 forward and backward to move the piston 72 similarly and contract and expand the displacer volume 70. When the motor 76 is rotated to pull the piston 72 to its rearmost position as shown in FIG. 4B, the displacer volume 70 is expanded so that the gaseous cooling media within the volume is expanded. This is referred to as adiabatic expansion and creates a very low temperature within the displacer 62. The cold displacer 62 conductively cools panel 34. As shown in FIG. 4A, displacer 62 includes a coupling member 78 which supports panel 34. The displacer may be formed of, for example, stainless steel, and coupling member 78 should have a high thermal conductivity. Therefore, copper would be a suitable material for coupling member 78. The panel 34 should also be formed of a metal with high thermal conductivity, such as copper. To ensure proper conductive heat transfer between the displacer 62 and panel 34, indium is preferably used to fill in any microscopic gaps between coupling member 78 and panel 34.

When panel 34 has been cooled to a desired low temperature, such as 100° K., panel 34 is ready to be exposed to the processing chamber to pump gas particles from the chamber and rapidly evacuated the chamber to a low pressure. Referring to FIG. 4B, the cryogenic panel 34 is shown exposed inside a processing chamber 80 formed by chamber housing 79 to act as a pump and evacuate the processing chamber. The bellows 58 of housing 32 is sealed at one end to housing 32 and at the opposite end to motor supporting member 66. When the linear slide bearing 42 moves along linear slide rail 40, the motor supporting member 66, motor 76, extension tube 64, displacer 62 and cryogenic panel 34 all move in a linear direction. This also produces movement of the cryogenic panel 34 from the first position within pump chamber 60 to a second position outside of pump chamber 60 and into processing chamber 80 as illustrated in FIG. 4B.

Upon movement of panel 34 to the second position, the bellows 58 contracts to contract the volume of pump chamber 60. Bellows 58 is attached to the motor supporting member 66 and housing 32 by appropriate seals 84 and 86, respectively, to isolate the pump chamber from the outside environment so that the cryogenic panel 34 is protected from atmospheric pressure within pump chamber 60. The bellows 58 operates to effectively isolate the cryogenic panel 34 even when the panel is moving between the first and second positions. While the present invention utilizes a bellows 58 to create the expandable portion of the pump chamber, it will be appreciated by a person of ordinary skill in the art that other ways of achieving a seal of the pump chamber during linear motion might be utilized. In the embodiment of the present invention illustrated in FIGS. 4A and 4B, the cryogenic panel is cooled by adiabatic expansion as previously described.

Referring now to FIG. 4A, when the panel 34 is in the first position and inside pump chamber 80, the motor 76 rotates to pull piston 72 to its rearwardmost position within displacer 62 (See FIG. 4B). This expands the volume 70 in displacer 62 and expands the cooling medium therein to adiabatically cool the displacer 62 and ultimately the cryogenic panel 34. Panel 34 then absorbs gas particles within pump chamber 60. When subsequently exposed to processing chamber 80, gas particles 87, such as water vapor particles, stick to the panel 34 and are thereby pumped from processing chamber 80 to drop the pressure within chamber 80 to a low vacuum level. The full exposure of panel 34 to the processing chamber 80 ensures rapid absorption of the gas particles, and ultimately, a rapid, high vacuum of chamber 80. The adiabatic displacer utilized in one embodiment of the present invention to cool the cryogenic panel might be replaced with a cooling medium supply which continually circulates liquid nitrogen or another suitable medium through the displacer for cooling the panel.

In accordance with the principles of the present invention, the pump chamber 60 is sealed from the processing chamber 80 when the cryogenic panel 34 is in the first position and is retracted within pump chamber 60. The sealing is achieved by a sealing element or sealing valve 90 which is coupled to pump housing 32 proximate aperture 38. Sealing valve 90 includes a valve gate 92 which is moved by a rod 94 coupled to a piston 96. A control line 98 introduces a fluid or a liquid to one side of piston 96 to move valve gate 92 when it is desired to seal aperture 38. More specifically, FIG. 4A illustrates the extension of valve gate 92 to seal aperture 38 when the cryogenic panel 34 is in the first position. Valve gate 92 has an appropriate sealing structure 93 which abuts against one or more walls of housing 32 to seal the pump chamber 60 from processing chamber 80. When it is desirable to expose panel 34 to processing chamber 80, valve 90 is operated to withdraw gate 92 and unseal aperture 38. Panel 34 may then be moved linearly along rail 40 into processing chamber 80. One suitable valve for the purposes of the present invention is a MESC (Modular Equipment Standards Committee) standard valve operable and dimensioned according to the guidelines of SEMI (Semiconductor Equipment and Materials International). A suitable MESC valve is a series 2 rectangular gate valve available from VAT Inc. (U.S.A.) of Woburn, Mass., which has a SEMI/MESC mechanical interface. Other valves may also be suitable for use with the present invention. When panel 34 is in the first position as shown in FIG. 4A, valve gate 92 effectively seals pump chamber 60 from processing chamber 80. Therefore, processing chamber 80 may be opened and exposed to atmospheric pressure without exposing panel 34 to atmospheric pressure.

The processing chamber 80 may be exposed or open to the atmosphere, such as to load a semiconductor wafer (not shown) or other device into the processing chamber or to maintain the chamber, for example. After the substrate is loaded or the maintenance is finished, chamber 80 is closed to atmospheric pressure and is ready to be evacuated. Once the chamber 80 is evacuated in accordance with the present invention any one of a number of predetermined processing steps may be performed on the substrate.

During operation, pump chamber 60 remains sealed until the processing chamber is rough vacuumed to a predetermined pressure. Specifically, the processing chamber 80 is coupled to a rough vacuum pump 102 which provides preliminary evacuation of the processing chamber 80 before the cryogenic panel 34 is exposed. The pressure gauge 104 monitors the pressure inside chamber 80. When the pressure is higher than a predetermined rough vacuum set point, which is generally within the 1 m Torr to 1 Torr range, the sealing valve 90 is closed to seal pump chamber 60 which will be maintained at a high vacuum due to the absorption of water particles in chamber 60. When the rough pumping starts, the pressure of the processing chamber 80 is reduced. Once the processing chamber pressure drops below the predetermined rough set point, valve 90 opens and the linear translating mechanism operates to move the cryogenic panel 34 through aperture 38 and into processing chamber 80. Referring to FIG. 4B, in the second position, the panel 34 is fully exposed to the processing chamber 80 and there is no pumping restriction or conduction restriction between the chamber 80 and the panel 34. This achieves maximum pumping speed with the cryogenic panel 34.

As an example of one embodiment of the present invention, a cold panel having generally longitudinal cross section dimensions approximately 200 mm×200 mm and a thickness of 5 mm may be cooled to below 100° K. to achieve a pumping efficiency of approximately 85%. That is, 85% of the water molecules reaching the panel 34 stick to the panel and are removed from the atmosphere of the processing chamber and 15% of the water molecules do not stick to the cold panel. Pumping speed to remove water particles achieved by such a panel is approximately 10,495 liters per second which is quite high compared to conventional cryopumps. Referring again to FIG. 1, a cryopump having an array 20 with a flange diameter of approximately 200 mm will achieve a pumping speed of approximately 4000 liters per second. If a 150 mm long and 200 mm diameter tube, including a valve 18, are attached to the vacuum chamber as shown in FIG. 1, the effect of pumping speed for water particles at the processing chamber 12 will only be approximately 1,600 liters per second. Therefore, the present invention provides a dramatic increase in pumping speed and vacuum efficiency over conventional pumps.

As with a conventional cryopump, the cryogenic panel 34 of the present invention requires regeneration because the panel becomes full with water particles. However, the panel of the present invention is retracted to a first position inside of the pump chamber 60 and sealed therein whenever the processing chamber 80 is open or vented to atmospheric pressure. Thus, the cryogenic panel 34 does not need to be regenerated before the inside of the processing chamber 80 is exposed to atmosphere. In the present invention, regeneration of the panel 34 is required only when the water pumping capacity or other gas pumping capacity of the panel has reached a full state. Furthermore, at the time of regeneration, the cryogenic panel 34 is withdrawn into the first position inside the pump chamber and thus regeneration is accomplished inside the pump chamber, and does not contaminate the processing chamber or the semiconductor wafer therein.

The regeneration of the panel 34 is accomplished when the amount of stuck water molecules 130 or other gas particles fill the panel 34. To begin regeneration, the panel 34 is retracted to the first position (FIG. 7). Valve 90 is then closed to seal pump chamber 60. Next, the inflow of the cooling medium to displacer 62 is stopped. Venting gas, such as nitrogen, is introduced into pump chamber 60 through port 132 and valve 134. Nitrogen is introduced until all of the stuck water molecules 130 evaporate, which may take anywhere from several minutes to several hours, depending upon the capacity of panel 34. The nitrogen may be heated before being introduced into the pump chamber 60 for faster evaporation. If the pressure inside chamber 60 becomes higher than atmospheric pressure, the nitrogen is vented through port 136 and a pressure relief valve 138. Once all of the water molecules 130 are removed from panel 34, valve 134 is closed and the nitrogen introduction ceases. To further decrease the regeneration time, a heater (not shown) on the panel 34 may be applied.

A rough valve 140, coupled to a rough pump (not shown), is opened to evacuate pump chamber 60. When the pressure in pump chamber 60 becomes lower than atmospheric pressure, relief valve 138 closes. Next, when the pump chamber pressure becomes lower than a rough set point between 1 and 1000 mTorr, the rough valve is closed to stop the rough pumping. The cooling medium flow is then resumed into displacer 62. Motor 76 starts and moves piston 72 to expand volume 70 and cool the displacer 62, which cools panel 34. When the temperature of cold panel 34 cools to below the temperature associated with the water vapor pressure of chamber 60, water molecules begin sticking to the panel 34. Accordingly, the pressure inside of the pump chamber decreases, and when it reaches a steady state point, the regeneration is complete.

Figure 5A:
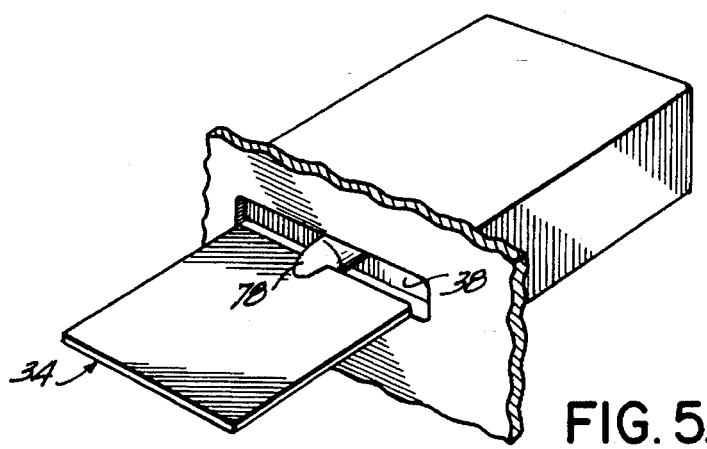
FIG. 5A is a perspective view of one embodiment of the cryogenic panel of the present invention shown exposed to the processing chamber.

The aperture 38 which couples the present invention to the processing chamber 80 may also be very small because the panel moves linearly within the processing chamber. Therefore, the aperture 38 can be very close to the size of the transverse cross-section of panel 34 and may generally resemble the shape of the panel transverse cross-section, such as a rectangular shape as illustrated in FIG. 5A. Aperture 38 does not affect the pumping speed of the present invention because pumping speed is proportional to the surface area of the panel 34 rather than the size of aperture 38. This is completely different from a conventional cryopump which has a pumping speed strongly dependent upon the size of opening or tube leading to the cryogenic element.

When the cryogenic panel 34 is cooled to absorb water particles, a high vacuum pump may be utilized to evacuate other gases from the processing chamber. Referring to 4A, the high vacuum pump 106 is coupled to a port 107 formed in housing 79. Alternatively, the high vacuum pump might be utilized within the pump chamber to eliminate the need for port 107 in the processing chamber. Specifically, referring to FIG. 4B, high vacuum pump 108 is shown, in phantom, coupled to port 109 of pump chamber 60. When the high vacuum pump 108 is positioned to evacuate the pump chamber 60, the pumping speed will be restricted by the small aperture 38; however, various semiconductor processing and other applications require a high pumping speed for water and only small pumping speeds for other gases. In such applications, the configuration of FIG. 4B may be useful.

Figure 5B:
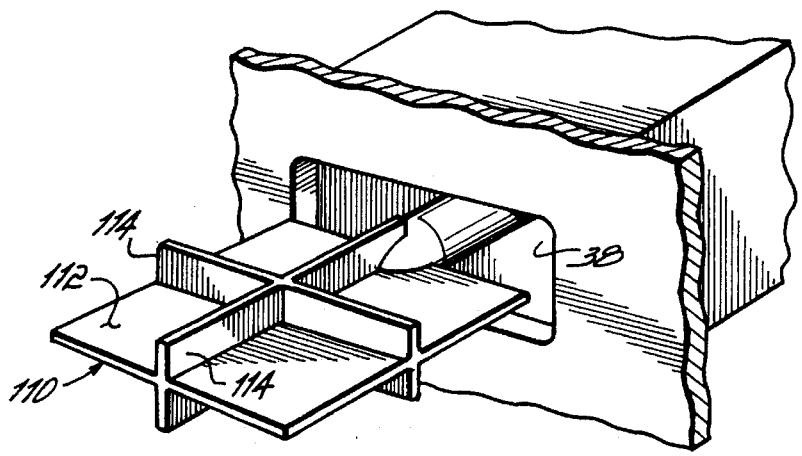
FIG. 5B discloses an alternative embodiment of the cryogenic panel of the present invention shown exposed to the processing chamber.

As illustrated in FIG. 5A, one embodiment of the present invention utilizes a planar panel as a cryogenic element. FIG. 5B discloses an alternative embodiment of the cryogenic panel of the present invention. As seen in FIG. 5B, panel 110 has a predominantly planar body 112. However, planar extension portions 114 extend to both sides of body 112 at generally right angles with respect to body 112. The extension portions 114 increase the overall exposed surface area of panel 110 and therefore increase the pumping speed of the panel. Extension portions 114 may take the shape of perpendicular ribs as shown in FIG. 5B, or may take other shapes and assume other angular orientations, the purpose being to increase the overall exposed surface area of panel 110. As may be appreciated, the aperture between the pump chamber and the processing chamber would have to be increased in its height dimension; however, the sealing valve 90 provides clearance for both embodiments of the panel as illustrated in FIGS. 5A and 5B.

While the present invention is useful for high speed pumping to rapidly achieve a high vacuum and a low pressure within a processing chamber, the pumping apparatus might also be useful to remove water particles from the processing chamber when the pressure is higher, i.e., a low vacuum. In some processing applications it is necessary to use process gases such as argon, nitrogen and oxygen, to name a few, at a higher processing pressure, such as several mTorr up to atmospheric pressure. If the temperature of the cryogenic panel 34 is carefully chosen so that only water molecules stick on the panel 34 and these other process gases do not stick on the panel, the pumping apparatus may be used at the higher pressure. One example of such a processing application utilizing other process gases is an RTP process for a cluster tool or Rapid Thermal Processing process to rapidly heat a semiconductor wafer. During RTP, the water pressure may be a problem; therefore, it will be desirable to remove the water. However, argon and nitrogen at atmospheric pressure are also used during the RTP process, and thus, it is desirable to leave such gases in the processing chamber. Generally, after the process has been completed, the RTP module will be pumped down to $10^{-7}$ Torr range within a minute. In such a case, the pumping time solely depends upon the water partial pressure inside the RTP chamber. If the cold panel is carefully cooled, it may then be exposed to the RTP chamber during the actual RTP process, and it will not pump argon and nitrogen, but will pump the water within the processing time. As a result, the pumping down to the $10^{-7}$ Torr range after the RTP process will be easily achieved.

Furthermore, the cryogenic panel of the present invention might be utilized to pump other gases instead of water vapor as previously mentioned. For example, if the panel is cooled to a lower temperature, e.g., 20° K., it can pump argon, nitrogen, oxygen, and other similar gases.

Figure 6A:
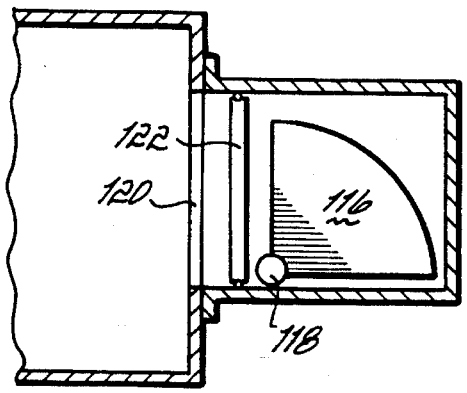
Figure 6B:
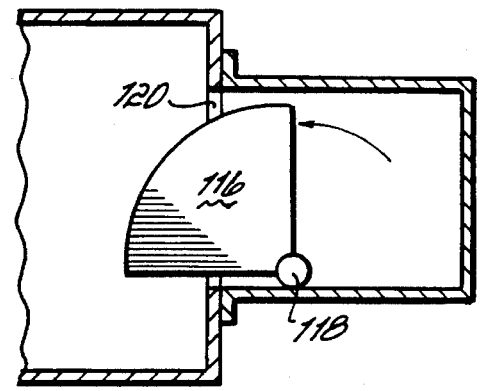
FIG. 6B shows the cryogenic panel rotated to a second, exposed position within the processing chamber.

An alternative apparatus for moving the cryogenic panel between the first retracted position and the second exposed position may be utilized instead of the linear slide rail disclosed in FIGS. 4A and 4B. Referring now to FIGS. 6A and 6B, the panel 116 may be mounted to pivot about a vertical axis member 118. As shown in FIG. 6A, the panel 116 may be pivoted to the first position whereupon aperture 120 is sealed with a sealing valve 122. When pumping the processing chamber is necessary, sealing valve 122 unseals aperture 120 and panel 116 is rotated about axis member 118 to be exposed to the processing chamber as illustrated in FIG. 6B. As may be appreciated by a person of ordinary skill in the art, other ways of displacing the panel between the first and second positions might be utilized in accordance with the principles of the present invention.

While the present invention has been illustrated by the description of embodiments thereof, and while the embodiments have been described in considerable detail, it is not the intention of applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A high speed pumping apparatus to efficiently and rapidly evacuate a semiconductor processing chamber to a desired vacuum pressure, the apparatus comprising:

a pump chamber for coupling to the processing chamber through an aperture;

a cryogenic element in the pump chamber to absorb gas particles and evacuate the processing chamber to said vacuum pressure, the cryogenic element having a first position inside said pump chamber and removed from the processing chamber and being movable, through the aperture, to a second position at least partially out of the pump chamber and inside the processing chamber to absorb gas particles from inside the processing chamber;

a sealing structure to seal the aperture when the cryogenic element is in the first position and effectively isolate the cryogenic element from the processing chamber;

whereby the cryogenic element may be exposed to evacuate the processing chamber and withdrawn to be protected when the processing chamber is opened to atmospheric pressure.

2. The high speed pumping apparatus of claim 1 further comprising a high vacuum pump coupled to the processing chamber to further evacuate the processing chamber when the cryogenic element is in the second position.

3. The high speed pumping apparatus of claim 1 wherein the sealing structure includes a valve gate which moves proximate the aperture to seal the aperture when the cryogenic element is in the first position and to unseal the aperture so that the cryogenic element may be moved to the second position.

4. The high speed pumping apparatus of claim 1 wherein the cryogenic element includes a generally planar panel.

5. The high speed pumping apparatus of claim 4 wherein the panel is formed of copper.

6. The high speed pumping apparatus of claim 4 wherein the cryogenic element includes generally planar extension portions extending at an angle to the panel to increase the surface area of the element.

7. The high speed pumping apparatus of claim 1 wherein the cryogenic element is operable to be moved generally linearly between the first and second positions.

8. The high speed pumping apparatus of claim 7 further comprising a linear slide rail proximate the pump chamber, a bearing member coupled to the cryogenic member and sliding on the rail to linearly move the cryogenic member between the first and second positions.

9. The high speed pumping apparatus of claim 1 wherein the cryogenic element is operable to be rotated between the first and second positions.

10. The high speed pumping apparatus of claim 1 wherein the pump chamber includes an expandable portion which expands when the cryogenic element is in the first position inside the pump chamber.

11. The high speed pumping apparatus of claim 1 wherein the cryogenic element includes a displacer with an expandable volume, the displacer volume operable to contain a cooling medium and being expandable to lower the pressure of the cooling medium and adiabatically cool the displacer and cryogenic element.

12. The high speed pumping apparatus of claim 11 wherein the cryogenic element further includes a planar panel coupled to the displacer to be cooled and absorb gas particles.

13. The high speed pumping apparatus of claim 1 wherein the cryogenic element includes an internal volume and further comprising a supply of cooling medium which is operable to continuously circulate the cooling medium through the internal volume and cool the cryogenic element.

14. A method of efficiently and rapidly evacuating a semiconductor or other processing chamber to a desired vacuum pressure comprising:

coupling a pump chamber to the processing chamber through an aperture, the pump chamber including a cryogenic element therein to absorb gas particles and evacuate the processing chamber to said vacuum pressure;

maintaining the cryogenic element in a first position inside the pump chamber and removed from the processing chamber when the processing chamber is exposed to atmospheric pressure;

sealing the aperture when the cryogenic element is in the first position to effectively isolate the pump chamber and cryogenic element from the processing chamber and atmospheric pressure;

unsealing the aperture and moving the cryogenic element through the aperture to a second position at least partially out of the pump chamber and inside the processing chamber to absorb gas particles from inside the processing chamber when the processing chamber is closed to atmospheric pressure;

whereby the cryogenic element may be exposed to evacuate the processing chamber and withdrawn to be protected when the processing chamber is opened to atmospheric pressure.

15. The method of claim 14 further comprising further evacuating the processing chamber with a high vacuum pump coupled to the processing chamber.

16. The method of claim 14 further comprising further evacuating the processing chamber with a high vacuum pump coupled to the pump chamber when the cryogenic element is in the second position.

17. The method of claim 14 further comprising sealing the aperture by moving a valve gate over the aperture when the cryogenic element is in the first position and unsealing the aperture by moving the valve gate away from the aperture so that the cryogenic element may be moved to the second position.

18. The method of claim 14 wherein the cryogenic element is moved in a generally linear path between the first and second positions.

19. The method of claim 18 wherein the pump chamber includes a linear slide rail, the method further comprising coupling the cryogenic element to the slide rail with a bearing member and sliding the bearing member on the rail to move the cryogenic member along the linear path between the first and second positions.

20. The method of claim 14 further comprising rotating the cryogenic element between the first and second positions.

21. The method of claim 14 wherein the cryogenic element includes a displacer with an expandable volume, the method further comprising supplying a cooling medium to the expandable displacer volume and expanding the volume to lower the pressure of the cooling medium and adiabatically cool the cryogenic element.

22. The method of claim 14 further comprising continuously circulating a cooling medium through a volume in the cryogenic element to cool the element.

23. The method of claim 14 further comprising:

moving the cryogenic element back to the first position after the element has absorbed gas particles from inside the processing chamber;

sealing the aperture to isolate the pump chamber from the processing chamber;

raising the temperature of the cryogenic element;

evaporating the absorbed gas particles from the cryogenic element to regenerate the element and prepare the element to further absorb gas particles.

24. The method of claim 23 further comprising introducing a gas into the pump chamber to assist in the evaporation of the absorbed gas particles.

25. A method of processing a semiconductor wafer or other substrate in a processing chamber at a vacuum pressure comprising:

coupling a pump chamber to the processing chamber through an aperture, the pump chamber including a cryogenic element therein to absorb gas particles and evacuate the processing chamber to said vacuum pressure;

maintaining the cryogenic element in a first position inside the pump chamber and removed from the processing chamber when the processing chamber is exposed to atmospheric pressure;

sealing the aperture when the cryogenic element is in the first position to effectively isolate the pump chamber and cryogenic element from the processing chamber and atmospheric pressure;

placing a substrate in the processing chamber;

closing the processing chamber to atmospheric pressure;

unsealing the aperture and moving the cryogenic element through the aperture to a second position at least partially out of the pump chamber and inside the processing chamber to absorb gas particles and evacuate the processing chamber to the vacuum pressure;

performing a predetermined process on the substrate while the processing chamber is maintained at the vacuum pressure;

whereby the cryogenic element may be exposed to evacuate the processing chamber and withdrawn to be protected when the processing chamber is opened to atmospheric pressure.

26. The method of claim 25 wherein the cryogenic element is moved in a generally linear path between the first and second positions.

27. The method of claim 25 further comprising rotating the cryogenic element between the first and second positions.

28. The method of claim 25 wherein the cryogenic element includes a displacer with an expandable volume, the method further comprising supplying a cooling medium to the expandable displacer volume and expanding the volume to lower the pressure of the cooling medium and adiabatically cool the cryogenic element.

29. The method of claim 25 wherein the cryogenic element includes a planar panel coupled to the displacer to be cooled and absorb gas particles.

* * * * *